United States Patent [19]
Spoelder

[11] 3,986,171
[45] Oct. 12, 1976

[54] STORAGE SYSTEM COMPRISING A MAIN STORE AND A BUFFER STORE

[75] Inventor: Gerrit Adriaan Spoelder, Beekbergen, Netherlands

[73] Assignee: U.S. Philips Corporation, New York, N.Y.

[22] Filed: Nov. 20, 1974

[21] Appl. No.: 525,649

[30] Foreign Application Priority Data
Dec. 21, 1973 Netherlands .................... 7317545

[52] U.S. Cl. ........................................ 340/172.5
[51] Int. Cl.² ........................................ G06F 9/10
[58] Field of Search ................ 340/172.5; 445/1

[56] References Cited
UNITED STATES PATENTS

| | | | |
|---|---|---|---|
| 3,394,353 | 7/1968 | Bloom et al. | 340/172.5 |
| 3,427,592 | 2/1969 | Bahnsen et al. | 340/172.5 |
| 3,541,529 | 11/1970 | Nelson | 340/172.5 |
| 3,581,291 | 5/1971 | Iwamoto | 340/172.5 |
| 3,693,165 | 9/1972 | Reiley et al. | 340/172.5 |
| 3,723,976 | 3/1973 | Alvarez et al. | 340/172.5 |
| 3,766,532 | 10/1973 | Liebel | 340/172.5 |
| 3,771,137 | 11/1973 | Barner et al. | 340/172.5 |
| 3,858,183 | 12/1974 | Amdahl et al. | 340/172.5 |
| 3,878,513 | 4/1975 | Werner | 340/172.5 |

*Primary Examiner*—Mark E. Nusbaum
*Attorney, Agent, or Firm*—Frank R. Trifari; Daniel R. McGlynn

[57] ABSTRACT

A storage configuration comprising a main store, a buffer store having a smaller storage capacity, and an associated address store, comprising an address generator in which successive addresses can be generated for identification of the words of the buffer store. Also provided are means whereby the successive addresses can be taken up in the address locations of the address store, with the result that the buffer store can be addressed as a store having successive addresses by way of the address store.

3 Claims, 6 Drawing Figures

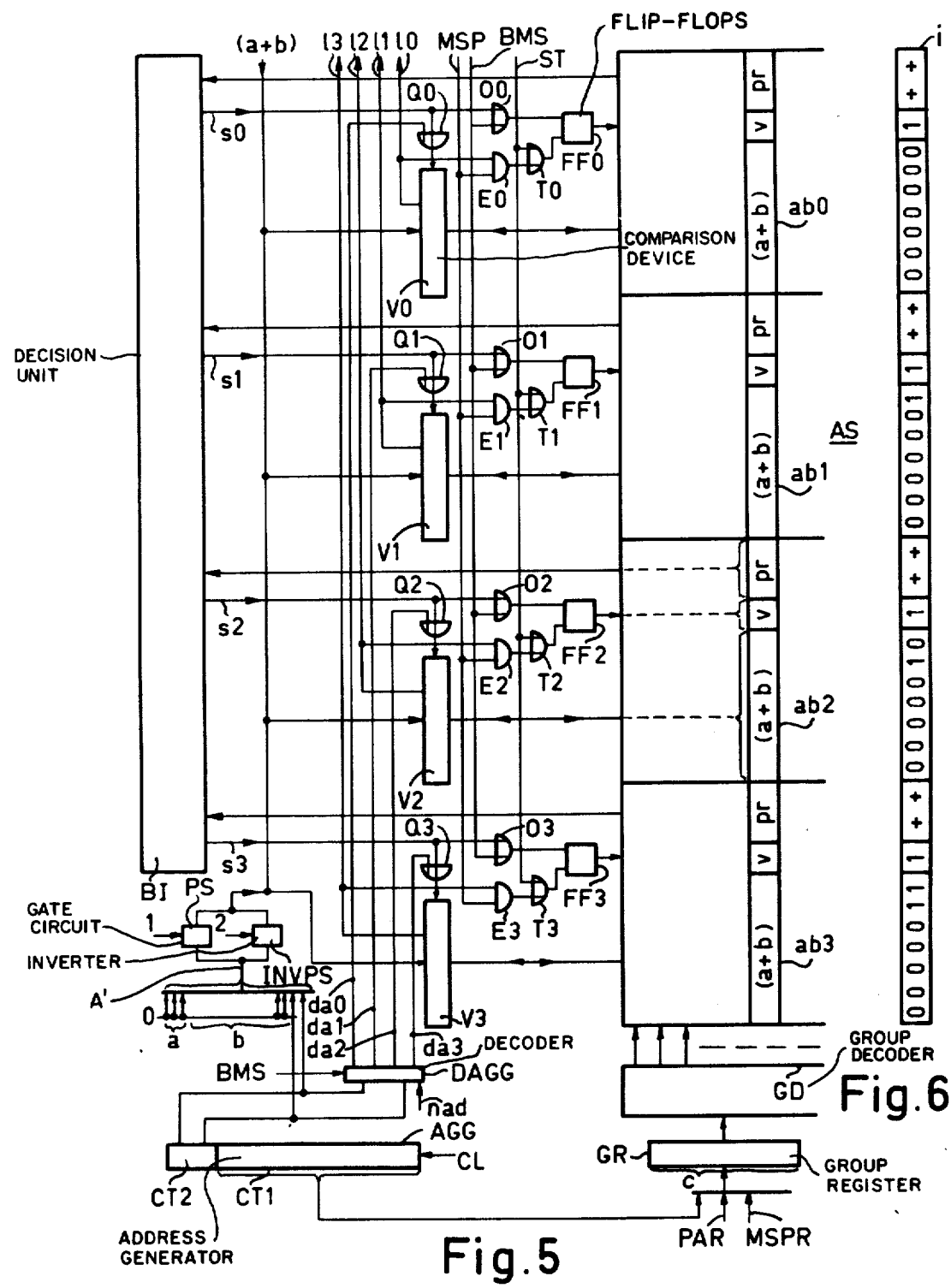

STORAGE SYSTEM COMPRISING A MAIN STORE AND A BUFFER STORE

The invention relates to a storage configuration comprising at least one slow main store having a large storage capacity which is divided into word blocks and at least one fast buffer store having a small storage capacity which is also divided into wird blocks, the number of word blocks thereof, however, being smaller than that of the main store, and furthermore comprising an address store which is divided into a number of address blocks which equals the number of word blocks of the buffer store, it being possible to store therein per address block the address of a word block present in the buffer store, the address store being provided with comparison means by means of which the address of a word block of a requested word can be compared with the address blocks stored in the address store of the word blocks present in the buffer store, the relevant word block in the buffer store being selectable in the case of correspondence and, if the address does not correspond, the word block being selectable from the main store and transportable to the buffer store and the relevant address being transportable to an address block of the address store. Such configurations are known and serve to enable better utilization of the speed of the processotrs co-operating with these configurations. The speed of the buffer store is in the same order of magnitude as the speed of the processor. The main store, being slow, can be very large, however, without its price becoming prohibitive. According to the present state of the art, the main store may be a magnetic core store and the buffer store may be an integrated semiconductor store.

However, in practice there will be cases where it is advantageous to have the possibility of using the buffer store as an independent store. This means: the relation with the main store is interrupted, and the buffer is no longer loaded on the basis of the most frequently used program parts and/or data. Such a case occurs when there is a fault in the main store so that this store will be out of operation for some time. However, the buffer store can then still be used if special steps are taken. The invention has for its object to enable the buffer store to operate as a normal store, that is to say as an independent store or as part of the main store. An additional advantage of this operation of the buffer store as a normal store is the following: the buffer store can be separately tested when it is disconnected from the remainder of the computer system in which it is incorporated. When the buffer store operates as a normal store, all buffer store words can be successively addressed and hence tested as regards incorrect or defective word locations or parts thereof.

Particularly in computer systems in which there are a plurality of buffer stores when use is made of a plurality of processors, it is very useful if each of the buffer stores can be separately tested.

This is possible for the buffer store in the storage configuration according to the invention in that an address generator is provided in which successive addresses can be generated for identification of the word blocks of the buffer store, means being provided by means of which the said successive addresses can be stored in the address blocks of the address store, so that the buffer store can be addressed, via the address store, as a store having successive addresses.

It is thus achieved that successive addresses are present in the address store by whereby, if such an address is applied externally or by the address generator, the relevent word block is selected in the buffer store via the comparison device indicating that the address is present in the address store. In order to facilitate the selection, notably in the buffer store, and to keep the comparison means simple (comparison of bit series which are as short as possible, bit also as few in number as possible), in a further embodiment of the configuration according to the invention the slow main store of the described storage configuration is divided into groups of word blocks, the buffer store being divided into the same number of groups of word blocks as the main store, but comprising less word blocks per group, the address store being divided into a number of groups of address blocks which is the same as the number of groups of word blocks of the main store. Furthermore, the number of address blocks per group equals the number of word blocks per group of the buffer store. Per address block the address of a word block present in the buffer store can be stored in a group. The selection in this storage configuration is divided into group selection and block selection in a group. In the comparison means provided for the address store, the address of a word block of a word requested from a selected group is compared with the address blocks stored in the address store in the selected group of the word blocks present in the same group of the buffer store. In the case of correspondence, the relevant word block can be selected in the buffer store. If the address does not correspond, the word block can be selected from the selected group of the main store and be transported to the same group of the buffer store, and the relevant address can be transported to an address block of the same group of the address store.

This division into groups for a storage configuration is known per se. In order to achieve the described object of the invention using such a group-divided storage configuration, this storage configuration according to the invention is characterized in that an address generator is provided in which successive addresses can be generated, a first address portion thereof serving for group selection and a second address portion thereof serving for identification of the word blocks per group of the buffer store, means being provided whereby the second address portion can be taken up in the address blocks per group of the address store, with the result that the buffer store can be addressed as a store having successive addresses by way of the address store in combination with the group selection.

When use is made of buffer stores in a storage configuration as described above, the presence of the address store is a necessity. In practice it is also desirable that this address can be fully tested. This complete testing of the address store can be very readily realized according to a further aspect of the invention in that an invertor device is provided in which the successive addresses to be taken up in the address block of the address store can be inverted, with the result that the buffer store can be addressed as a store having successive inverted addresses by way of the address store.

U.S. Pat. Nos. 3,451,529 and 3,723,976 are herein incorporated by reference to illustrate the processor, comparison device, and other system components.

In the case of a store which is divided into groups as above, according to a further aspect of the invention the address generator can be a group counter provided the selection of the groups of the configuration, the counter being extended by a number of bits $n$, $2^n$ being equal to the number of addresses of the address store which corresponds to the word block storage capacity per group of the buffer store.

It is thus possible to write in each bit location of the address store a 1 bit or a 0 bit in the one case, and a 0 or a 1 bit in the other case. If in both cases, i.e., address written in a non-inverted manner as well as address written in an inverted manner, correspondence occurs during the successive application of all addresses or inverted addresses via the comparison devices, the bit locations of the address store are in good condition.

The invention will be described in detail hereinafter with reference to the drawing.

FIG. 5 shows a part of the storage configuration of FIG. 4, provided with the characteristics of the invention.

FIG. 6 shows the address contents of a group of the address store of FIG. 5.

Figure 1:
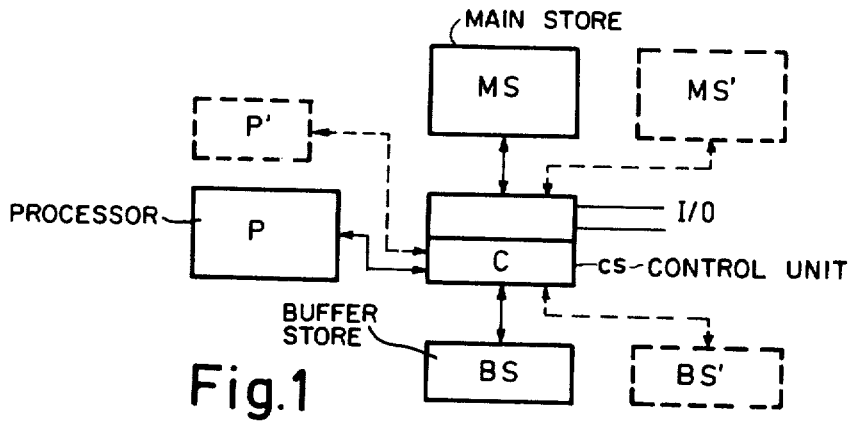
FIG. 1 shows a computer system comprising a storage configuration comprising a main store and a buffer store.

FIG. 1 shows a computer system, comprising a processor P, a main store MS, a buffer store BS, a control unit CS and input/output provisions I/O. The buffer store BS serves to enable better utilization of the speed of the processor P, in spite of the limitation imposed by the use of a comparatively slow large main store MS. The reference CS in FIG. 1 denotes the control unit which controls all traffic between the stores, the processor and the "exterior". The construction of this control unit CS will be described herein only in as far as is required for a proper understanding of the invention. This is denoted in CS by C. The blocks of FIG. 1 which are denoted by broken lines indicate that in such a computer system a plurality of processors P' and/or a plurality of main stores MS' and buffer stores BS' can be present.

Figure 2:
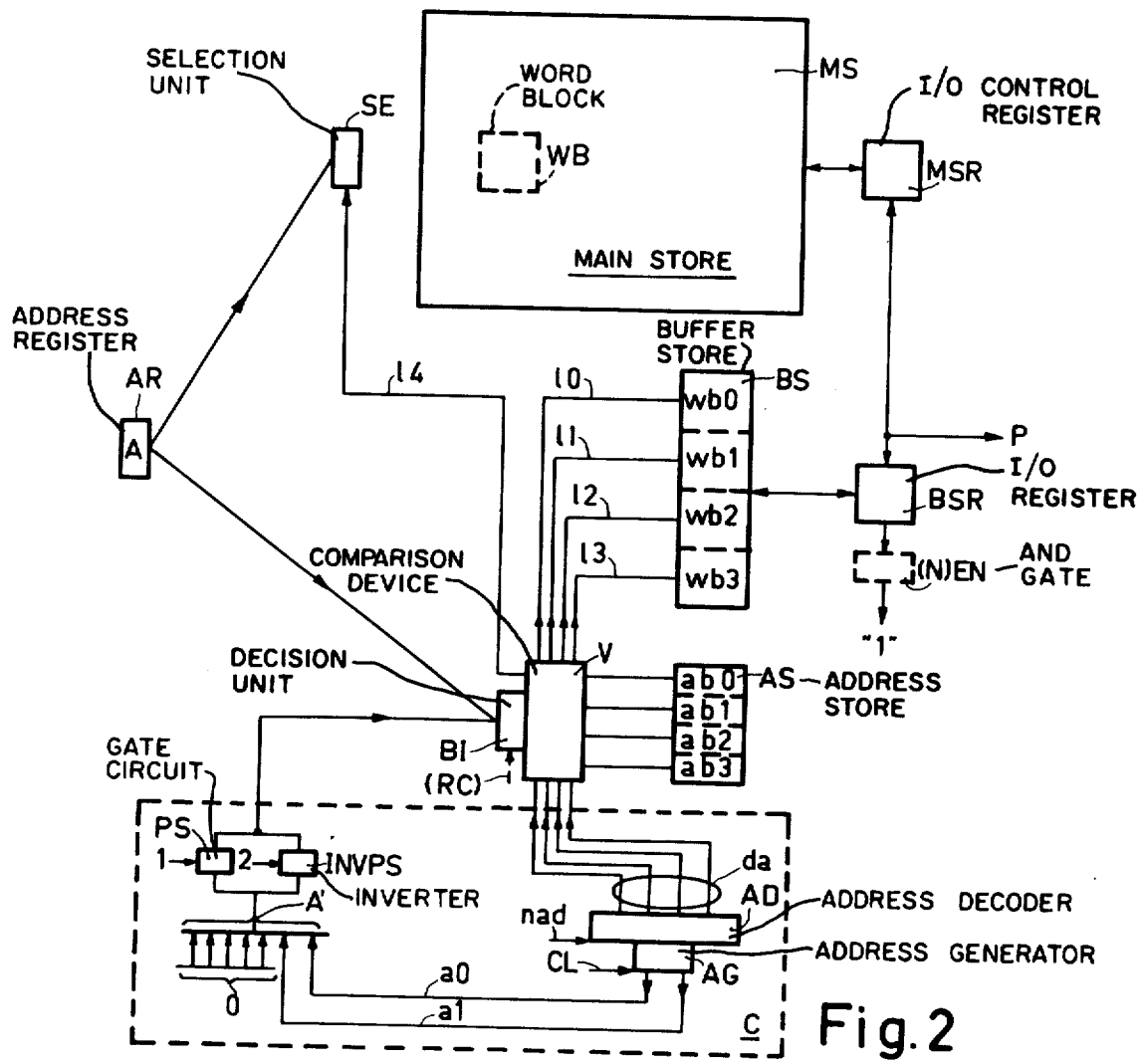
FIG. 2 shows an embodiment of a storage configuration according to the invention.

FIG. 2 shows a first embodiment of the storage configuration according to the invention. Therein, MS again denotes the main store, provided with a selection unit SE, by means of which a word block WB can be selected from the main store MS when an address A is applied in the address register AR. The writing/reading of the word block WB is effected via the input/output control register MSR. In this embodiment the buffer store BS comprises four word blocks, the locations in BS of which are denoted by $wb0$, $wb1$, $wb2$ and $wb3$. This number has been chosen to keep the description simple. The input/output register of the buffer store is denoted by BSR. Also provided are an address store denoted by AS and a comparision device denoted by V. Another practical set-up is that in which the comparison means for the address store consist in the address store itself being associative. The address store can contain as many addresses as there can be word blocks present in BS. The locations of these addresses, the so-termed address blocks, are denoted by $ab0$, $ab1$, $ab2$ and $ab3$. In the comparison device V, an address A applied in register AR is compared with the addresses stored in address store AS. This can be effected for all addresses simultaneously, or consecutively, so that less comparison logic is required. If AS is an associative store, this is effected automatically for all addresses simultaneously. If one of the addresses corresponds, a relevant line 10, 11, 12 or 13 is energized, the word block in buffer store BS associated with the relevant address thus being selected. This word block can then be read to the processor (denoted by P) or be written from the processor P. However, if the word block WB having the address A is not present in the buffer store BS, no correspondence occurs for the relevant address A in device V; this is signalled via line 14 and the word block WB is selected from the main store. This word block WB can then be written/read via register MSR. The following then also occurs: the contents of the word block WB are also applied to BSR, because this word block must be stored in the buffer store BS as being the word block used last in accordance with the principle of this storage configuration set-up. If BS is already fully occupied a previously stored word block must be written over or, if necessary, even be removed therefrom and transferred to the main store; the latter is the case if writing may take place in a word block of the buffer store without this being registered in the main store. Which of the word blocks stored is due for such a transfer, is determined in decision unit BI in which the decision is made on the basis of, for example, the criterion "first in, first out". Other possible decision criteria are, for example, "last recently used" or "frequency of use". In order to enable such a decision to be made, the address blocks abi in AS are provided with additional information bits. This will be described hereinafter (with reference to FIG. 5). On the bases of the decision, an address block abi in AS and the corresponding block wbi in BS are vacated, and the address A from register AR and the associated word block WB can be stored in address block abi of AS and in word block wbi of BS, respectively.

According to the invention, an address generator AG is present in the described and known storage configuration. This generator AG can generate successive addresses, starting at 00, under the control of a clock signal on input CL. AG is connected in this case as a binary counter, and produces the successive addresses 00, 01, 10 and 11 in the present example. If the buffer store BS according to the invention is to operate as a normal store, in this example these addresses are successively complemented, via the lines $a0$ and $a1$ and further, with bits of a given value, in this case denoted by "0", and applied as a complete address, A', via a gate circuit PS which is energized on its input 1, to the address store AS. Moreover, the addresses from the generator AG are decoded in an address decoder AD and, via lines da, the successive address blocks adi of AS are successively assigned thereby. The address buffer AS is thus successively filled with the said addresses 000...000, 000...001, 000...010 and 000...011 (loading action). The described decoding of the addresses of the address generator AG is not necessary if, before the buffer store is put into operation as a normal store, the decision unit BI has been set to a starting position (the command RC stated between brackets), so that the decision unit BI, when the said addresses A' are applied, successively fills the address store AS with the addresses A' automatically. It is to be noted that the complementation of the successive addresses with values other than 0-bits can also be effected. For example, a given address, serving as a basic address, is added to the said successive addresses (indexing).

Subsequently, the buffer store can be used as a normal store: when an address A is within the address space of A', or in other words when A represents one of the addresses A', a signal will appear in the comparison device V on the relevant line $l_i$, so that the relevant word block in BS is selected (selection action). The address space of successive addresses is thus determined by the capacity of the buffer store, while the addresses themselves are successively determined by the code at which the address generator starts the generation of addresses. In practice this will usually be a 0-starting position, with the result that the address space has successive addresses increasing from 0 to N, N being the number of word blocks of the buffer store. If the buffer store, provided with successive addresses in the described manner, is used as part of the main store, for example, for the main store MS each address can be increased by a value N, with the result that BS is added as if it were to the bottom of MS.

An important possibility which is realized using this set-up according to the invention is the following: the buffer BS can be tested off-line, i.e., completely separate from the system, and notably separate from the main store. This is because the buffer BS can be directly addressed by successive addresses. These addresses can also be supplied by the processor. It is also possible to use the address geneataor AG for this purpose: the addresses A', supplied in reaction to clock pulses on terminal CL by AG and supplemented by 0-bits, are compared in V with the contents of AS and a relevant word block in BS is selected. During this action, AD must be disconnected to ensure that the selection is effected in AS and hence not in BS directly via one of the lines $da$. To this end, a signal $nad$ is applied to the decoder AD. The testing of BS can further be performed in known manner. An often used method is: application of bit patterns, reading these patterns and evaluating the result by way of parity tests.

A next method is described herein by way of example for the sake of clarity: generate all successive addresses A' in a reaction to a command on input CL of AG, and select the successive word blocks in DS therewith. Write 1 bits in all these word blocks. Subsequently: make all addresses A' again and read the word blocks: this should produce a 1-bit for each bit. This can be tested, for example, by performing an AND-operation on the output of register BSR. This is indicated in FIG. 2 by the AND-function gate (N)EN denoted by broken lines. If all bits have the value 1, this produces a "1". In order to complete the test, it should also be tested whether all bit locations of the buffer BS can also have 0-bit values. To this end, the foregoing can be repeated (generating all addresses A') first nothing but 0-bits being written, followed by reading and testing whether all bits read are indeed 0-bits. This can be effected by inverting the contents of register BSR and by performing the AND-operation again. This is indicated in FIG. 2 by the N stated between brackets near the AND-function gate (N)EN.

The described store configuration according to the invention also offers the possibility of fully testing the address store. Via PS, all addresses A' are thus applied to address store AS in "non-inverted" form. During the successive interrogation of the addresses from the processor or from the address generator AGS as described above (AD disconnected), correspondence should each time occur. If this is so, the address store is in order, at least as far as the "non-inverted" address A' is concerned. For the complete testing it is necessary to test the address store also for the inverted address. To this end, the embodiment shown in FIG. 2 comprises an inverter device INVPS which also serves as a gate circuit. When input 2 of INVPS carries a command, no command is present on input 1 of the gate circuit, and an address A' is applied to the address store in inverted form. Therefore, during the above loading action inverted addresses are taken up in the address blocks of AS. After the former loading action for the "non-inverted" addresses as well as after the latter loading action for the inverted addresses, correspondence should each time occur during the successive selection, after each of these loading actions, of the same addresses by applying the addresses again to the comparison device V and by comparing them with the addresses stored in the address store at the relevant instant. Correspondence means that the bit locations of the address store can all contain a 0-bit and a 1-bit. The condition of the address store has thus been tested.

Figure 3:
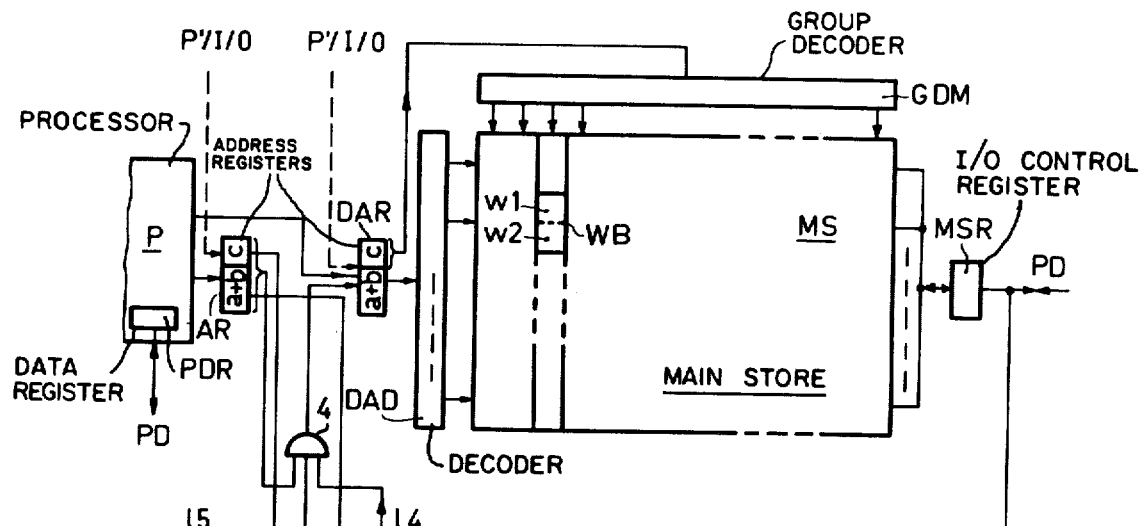
FIG. 3 shows an address format as used in the configuration of FIG. 4.
Figure 4:
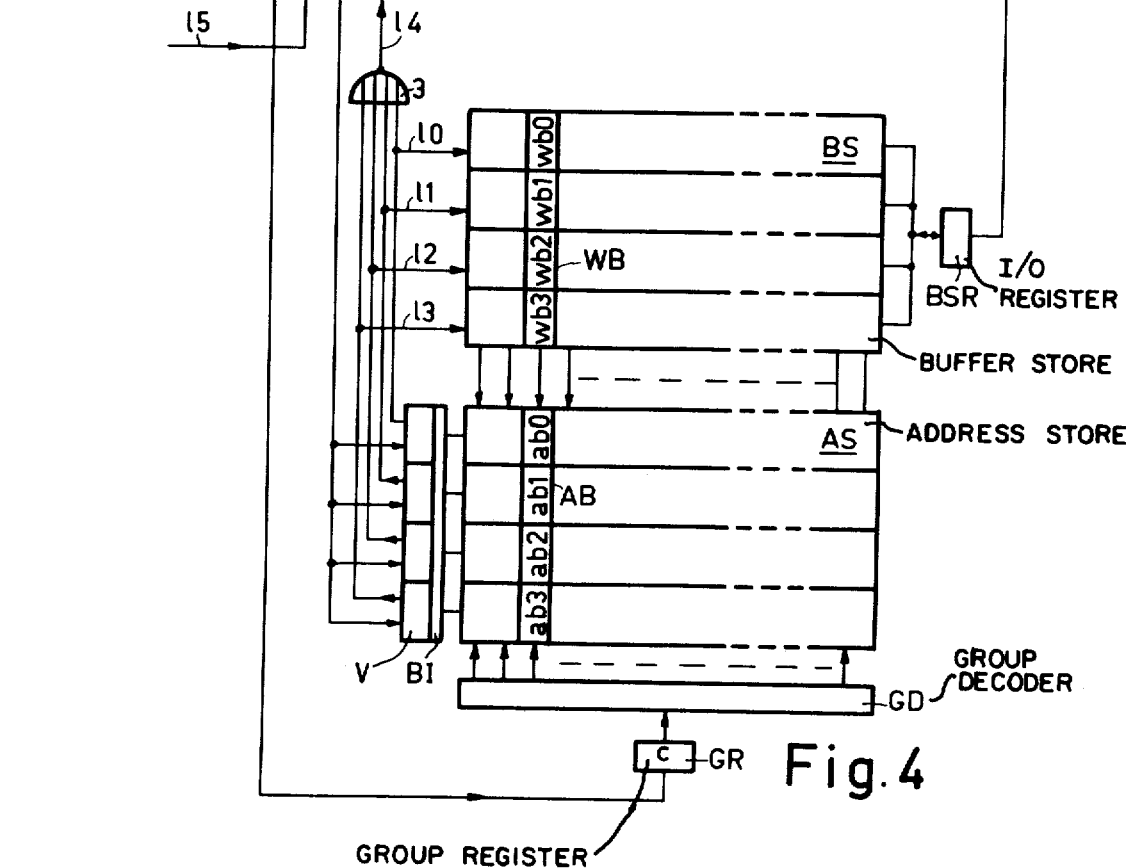
FIG. 4 shows another embodiment of a storage configuration to be used according to the invention.

FIG. 3 shows an address format (structure) of a storage configuration which is divided into a number of groups of word blocks for the store as well as for the buffer store. The number of group is the same for both stores, i.e., $2^c$, $c$ being the number of bits required for individual identification of each group. $2^b$ is the number of word blocks associated with each group of the main store or in banks of the main store. $b$ is the number of bits required for this purpose. Finally, there may be a number of $2^a$ storage banks which together constitute the complete main store MS. $a$ is the number of bits required for this purpose. The description given with reference to the FIGS. 4 and 5 is based on this address format. $a$ and $b$ are taken together, and the main store is considered as one unit even though it consists of a number of separate storage banks $2^a$. Similarly, more than one system of a buffer store and an address store can be used in FIGS. 4 and 5. However, since this is not important for a proper understanding of the invention, this will not be elaborated herein. It is to be noted that wherever possible the notations used in the FIGS. 4 and 5 correspond to those used in FIG. 2.

FIG. 4 shows the set-up of a storage configuration according to the invention, having a division into groups of the separate stores: main store MS, buffer store BS and address store AS, again comprising comparison device V even though in this case AS and V can together constitute an associative store again. FIG. 4 shows a processor P having a data register PDR for processor data PD. Also shown is an address register AR which can contain an address having an address format as shown in FIG. 3. The register AR can be filled with an address ($a+b+c$) from processor P or from another address source, for example, a processor P' or a peripheral apparatus, denoted by the general reference I/O. A further address register DAR is provided for the main store MS. Therein, addresses ($a+b+c$) for selection in MS can be stored. These addresses can originate from P, P', I/O. The address part $c$ then serves for the group selection in MS. For this purpose $c$ is decoded in group decoder GDM. An address present in register AR serves for the selection in the buffer store BS. Address part $c$ is stored in group register GR and is decoded in group decoder GD, a group then being simultaneously selected in BS and in the address store AS.

The address part ($a+b$) in the register DAR serves for the selection in a group of the main store MS. ($a+b$) is decoded in decoder DAD, so that a word block WB within a group is selected. A word block WB can comprise a number, for example 2 or 4, of storage words w1, w2. Such a selected word block can then be written or read via input/output register MSR. The data are, for example, the said processor data PD. Obviously, these data can also orginate from other sources, or be transported to other receivers.

The presence of the registers AR and DAR is necessary to ensure that independent selection within MS and BS is possible. A processor P, for example, is occupied with BS, while, simultaneously and I/O activity takes place with MS. The buffer store BS has a limited storage capacity per group. In this example, in view of the simplicity of the description, it comprises four word block locations, i.e., wb0, wb1, wb2, wb3, per group. Upon selection via the lines 10, 11, 12 or 13, one of the word blocks can be written or read via the input/output register BSR. The address store AS contains the bits $a+b$ of the word blocks which are stored per group in the buffer BS, because group selection is again automatically effected via GR and GD. The address blocks AB are equal per group to the number of word blocks per group of BS, so again four: ab0, ab1, ab2 and ab3. When an address is applied in AR, the part ($a+b$) thereof is applied to the comparison device V. The contents of the address blocks ab0, ab1, ab2 and ab3 of the selected group (part c of the address in AR) are compared with the value ($a+b$) in V. If correspondence occurs for one of them, this is signalled on the relevant line 10, 11, 12 or 13, and the corresponding word block in BS is selected. If no correspondence is signalled, a 1-signal appears on line 14 behind the NOR-function gate 3. This 1-signal on 14 prepares AND-function gate 4, the address in AR thus being transported to DAR if this path is released via line 15. Line 15 carries a 1-signal when MS is free to select a new address. Subsequently, the selection of the address part ($a+b$) in the main store MS is effected. The contents of the word block then found are transported, via MSR, to the processor P and also to BSR in order to be taken up in the buffer BS. If BS is fully occupied, the decision device BI decides in which location of still the same group this word block will be stored. The address part ($a+b$) of this word block is then stored in the address store in the corresponding location in the same group. If, disregarding the loading of the buffer, normally only reading is effected in the buffer, the "old" word block and its address can be erased. If write actions are also possible on word blocks in the buffer without this being directly registered in the main store, the word block to be ejected from the buffer is transported, for example, during a next cycle of the main store, to its location again in the said group of the main store. Use is then also made of the address block present for the word block in the address store AS, but which has now also been ejected. How this is realized in practice is known per se and need not be elaborated herein as it is of no significance for a proper understanding of the present invention.

FIG. 5 shows the part of the storage configuration of FIG. 4 which is important for the invention, together with the characteristics of the invention for this configuration.

Therefore, FIG. 5 shows: the address store AS, the comparison device V, in this case sub-divided into sub-units V0, V1, V2 and V3, flipflops FF0, FF1, FF2 and FF3, the decision device BI, an address generator AGG, comprising a decoder DAGG, and further the group register GR and the group decoder GD, and finally the AND-function gates E0, E1, E2 and E3 and the OR-function gates O0, O1, O2 and O3, Q0, Q1, Q2 and Q3 and T0, T1, T2 and T3. The address blocks ab0, ab1, ab2 and ab3 of the address store are each divided into parts: ($a+b$) for the storage of the address part ($a+b$) which provides the selection within a group, v for the storage of a so-termed validity bit which serves to indicate whether a relevant word block is to be considered valid (having usable contents) or unvalid (so ignorable, and hence erasable), and the part pr in which so-termed priority bits are located which are used in the decision device BI in order to enable a decision to be made as regards which word block may (must) be erased or ejected when the buffer store is completely occupied. For the simplicity of the description, it is assumed hereinafter that a new word block and the associated address can simply erase an "old" word block and its address (the case involving a buffer store in which only reading is effected, and in which there are not intermediate modifications in the word blocks of the buffer. In addition, modifications can be registered in the main store MS. In that case, if a modified word block is present in BS, this block must be declared unvalied (see also hereinafter with reference to validity). When the use of a storage configuration comprising a buffer store and an associated address store commences, first the assembly must be put in a starting position. In the set-up shown in FIGS. 4 and 5, this is effected as follows: the v-bit of each address block abi must be set to unvalid, assume = 0. Everything is thus released, so that the starting position has been adjusted. Setting the v-bits to 0 is simply effected as follows: there is provided a counter CT1 (which can also form part of address generator AGG, which will be described hereinafter) which successively counts down all groups from 0 to $2^c$ in a reaction to clock pulses on input CL. For the benefit of this counting down, there is a 1-signal on line ST (start line) which sets, via the OR-gates T0 to T3, the relevant flipflops FF0 to FF3 to the 0-position which is written, by way of a write command, in the v-bit locations of the address blocks ab0 to ab3, i.e. in each position of the counter CT1. The counter counts down all groups: counter position x is used, via group register GR and decoder GD, for the selection of group x. After all $2^c$ positions have been passed through each v-bit has been set to 0.

The storage configuration can then operate as desired: the buffer store in combination with the main store: addresses ($a+b+c$) are applied, i.e. split into the group part c and the part ($a+b$) etc. as described above. The comparison is simultaneously effected in the sub-comparison devices V0 to V3. If there is correspondence and v=1 for the relevant case (this $v = 1$ can be determined, for example, in each V0 to V3) signalling occurs on the relevant line 10, 11, 12 or 13. The corresponding word block of the same group of the buffer store is selected etc. as described above.

If there is no correspondence, it is determined, on the basis of the values represented by each of the bits pr, in the decision device BI in which location in the selected group of the buffer srote the word block having the address ($a+b$) which is not present in the address store will be written. To this end, one of the lines s0, s1, s2 or s3 is energized. The associated OR-function gate Q0, Q1, Q2 or Q3 thus supplies the relevant comparison device V0, V1, V2 or V3 with a command which transports the address $(a+b)$ applied for comparison to the address location of the address block $abi$ of the address store. Therefore: if $ab2$ has been assigned to be erased, $s2$ supplies a 1-signal and V2 is controlled, via Q2, to place the address $(a+b)$ in $ab2$. Simultaneously, the energized line, in this example $s2$, actuates the flipflop FF2 via OR-function gate O2. This flipflop FF2 is set and a $v = 1$ bit is transported to the validity bit location of $ab2$. In this situation line 12 also carries a 1-signal, because correspondence has been created by the storing of $(a+b)$ in $ab2$, so that the word block $wb2$ (FIG. 4) is filled with the data associated with this address $(a+b)$.

If an action takes place in the computer system (compare FIG. 4) involving a transfer of data from the "outside", i.e. from a peripheral apparatus or from other parts of the computer system, to the storage configuration and notably to the main store, it must be ensured that, if an address, in reaction to which writing takes place in the main store, is also present in AS, the validity bit v becomes 0. This is also indicated in FIG. 5; in the state: main store connected to "outside" line MSP carries a 1-signal which is applied to the AND-function gates E0, E1, E2 and E3. If correspondence occurs in one of the devices V0, V1, V2 or V3, the gate $Ei$ is opened via the relevant $li$, and the output signal thereof is used to reset the flipflop $FFi$, via the OR-function gate $Ti$, the validity bit $v$ in the address block $abi$ thus becoming 0.

For the group register GR it is also stated from which location the $c$ of an address $(a+b+c)$ can originate: PAR, that is to say from the processor (see the $c$ from register AR in FIG. 4); MSPR, that is to say from a register from which the above action between the "outside" and the main store is effected.

In order to enable the buffer store to operate as a normal store according to the characteristic of the invention in the above configuration, the group counter CT1 is extended with a part CT2, and these parts together constitute the so-termed address generator AGG (compare the address generator AG in FIG. 2). For the part CT1 it remains applicable that it serves for the group selection as already described. When the buffer store BS and its address store AS must operate as a normal store (i.e. AS must have successive addresses which are used to enable selection in BS as if BS were a normal store having successively addressed word blocks), line BMS carries a 1-signal. This signal is applied, via the OR-function gates O0, O1, O2 and O3, to the set input of the flipflops FF0 FF1, FF2 and FF3. Each validity bit $v$ of all address blocks thus becomes 1. Moreover, the line BMS is connected to decoder DAGG in which the counting positions of CT2 are decoded. The counting capacity of CT2 is determined by the number of word blocks present in the buffer store per group. In this case there are four. This means that CT2 comprises 2 bits for $2^2 = 4$ counting positions. The filling of the address store AS with successive addresses is then effected as follows: the address generator AGG operates in reaction to clock pulses on input CL. Assuming that the starting position is 00/0 ... 00, first in the $0^{th}$ group in the $0^{th}$ address block $ab0$ the code 00 is placed (before the stroke of said position), again as an example, supplemented by all 0-values, so that the complete address $(a+b) = A'$ has the value 000 ... 000. The said code 00 is decoded in the decoder DAGG and produces a signal on line $da0$ by which the said address $(a+b) = A'$ is placed in the address location of $ab0$ via V0. If the next position of CT1, CT2 is 00/0 ... 01, the $1^{st}$ group is indicated, and the address $A'$: 000 ... 000 is placed in the $1^{st}$ group in location $ab0$ as described above. The next position of CT1, CT2 is 00/0 ... 10, whereby the $2^{nd}$ group is indicated, and the address $A'$: 000 ... 000 is written in this group at location $ab0$. This is continued for all groups. When all groups have had their turn, the position of CT1, CT2 is 01/00 ... 00. The $0^{th}$ group is then indicated again, but now the code 01 is decoded in DAGG, which means that a 1-signal appears on $da1$. As a result, the code 01, supplemented by zeroes:000 ... 001, is written in the address location $ab1$ of this $0^{th}$ group. This process is repeated until the entire address store has been filled with successive addresses. For the purpose of illustration, FIG. 6 shows the contents of the address store for a group i.

FIG. 6 is arranged adjacent FIG. 5 in order to show how it fits in the assembly. At the locations $pr$ of the priority data crosses are given because in this case the contents thereof are not important.

Using very simple means (notably the entension of CT1 by CT2) the object of the invention is thus achieved. when an arbitrary address $(a+b+c)$ situated within the address space of the address store filled in the described manner is applied, one of the lines 10, 11, 12 or 13, after comparison of the part $(a+b)$ in the comparison devices V0, V1, V2 and V3, carries a 1-signal and the corresponding word block of the said group (indicated by address part $c$) is selected in the buffer store BS.

The testing of the buffer and of the address store is further as described with reference to FIG. 2. For this purpose FIG. 5 shows, like FIG. 2, the signal $nad$ and the arrangement including the gate circuit PS with input 1 and the inverter gate circuit INVPS with input 2.

What is claimed is:

1. A data processing system including a processor and a storage configuration including a first store and a relatively faster second store, wherein data is organized in each of said stores in at least one data class and wherein each data class is composed of at least one word block having a predetermined number of words of data, each word having a plurality of word portions, the number of words in said second store being less than the number of words in said first store, comprising
    means for supplying from said processor a predetermined word block address a predetermined word block for addressing individual word blocks within said first and second store;
    means for storing said predetermined word block address;
    address store address store means for storing addresses of word blocks stored in said second store;
    comparison means for comparing said stored predetermined word blocks address with said addresses stored in said third means, and for producing a selecting signal if said stored predetermined word block address does not correspond with said addresses stored in said third means;
    selection means responsive to said selecting signal for effecting a transfer of said predetermined word block from said first store to said second store;
    transfer means responsive to said selecting signal for effecting a transfer of said predetermined word block address from said second means to said address store means; and activating means for modifying the mode of addressing said second store;

address generator means responsive to said activating means, for generating successive addresses of word blocks in said second store and loading these addresses in said address store means for addressing said second store.

2. A system as defined in claim 1, wherein said address generator means further comprises an inverter for inverting said successive addresses generated so that said second store is addressed through said address store means by means of successive inverted addresses.

3. A data processing system including a processor and a storage configuration including a first store and a relatively faster second store, wherein data is organized in each of said stores in at least one data class and wherein each data class is composed of at least one word block group the number of word groups in said first and second store being equal, said word blocks each having a predetermined number of word blocks of data, said second store having fewer word blocks per group than said first store, comprising an address store divided into a number of groups of address blocks equal to the number of groups of word blocks of said first store, the number of address blocks thereof for each of said groups being equal to the number of word blocks for each of said groups of said second store;

data selection means for selecting data for processing by said processor from said first store and said second store, comprising group selection means and block selection means comparison means connected to said address store for comparing the address of a word block of a word requested from a selected group selected by said group selection means with the address blocks stored in the address store in said selected group selected by said group selection means of word blocks present in said second store;

means for generating a selection signal for selecting the relevant word block in the selected group in the first store when said comparison means indicates non-corresponce;

means for generating a selection signal for selecting the relevant word block in the selected group in said second store when said comparison means indicates correspondence; activating means for modifying the mode of addressing said second store;

means for generating successive addresses of data in said second store, responsive to said activating means, including a first address portion of each of said successive addresses for group selection and a second address portion of each of said successive addresses for selection of a predetermined word block of the group of said second store selected by first address portion and for transferring these addresses to said address store; and said address store further comprising means for receiving the second address portion in said address blocks of said selected group as determined by said group selection means, for addressing said second store as a store having successive addresses.

* * * * *

UNITED STATES PATENT AND TRADEMARK OFFICE
CERTIFICATE OF CORRECTION

PATENT NO. : 3,986,171
DATED : October 12, 1976
INVENTOR(S) : GERRIT ADRIAAN SPOELDER It is certified that error appears in the above-identified patent and that said Letters Patent are hereby corrected as shown below:

Claim 1, line 11, "address" should be --address of--
line 16, "address store address store" should be --address store--
line 20, "third" should be --address store--
line 23, "third" should be --address store--
line 29, "second" should be --storing--

Signed and Sealed this

First Day of November 1977

[SEAL]

Attest:

RUTH C. MASON
Attesting Officer

LUTRELLE F. PARKER
Acting Commissioner of Patents and Trademarks